(12) United States Patent
Chan et al.

(10) Patent No.: US 8,767,801 B1
(45) Date of Patent: Jul. 1, 2014

(54) TESTING PERFORMANCE OF CLOCK AND DATA RECOVERY CIRCUITRY ON AN INTEGRATED CIRCUIT DEVICE

(75) Inventors: Allen Chan, San Jose, CA (US); Wilson Wong, San Francisco, CA (US)

(73) Assignee: Altera Corporation, San Jose, CA (US)

( * ) Notice: Subject to any disclaimer, the term of this patent is extended or adjusted under 35 U.S.C. 154(b) by 452 days.

(21) Appl. No.: 12/729,732

(22) Filed: Mar. 23, 2010

(51) Int. Cl.
*H04B 1/38* (2006.01)

(52) U.S. Cl.
USPC ........... 375/219; 375/220; 375/221; 375/222; 327/146; 714/716

(58) Field of Classification Search
USPC ........... 375/219–222; 327/146; 714/724–744; 326/39
See application file for complete search history.

(56) References Cited

U.S. PATENT DOCUMENTS

| | | | |
|---|---|---|---|
| 2002/0190751 A1* | 12/2002 | Lee et al. | 326/39 |
| 2007/0057709 A1* | 3/2007 | Miyazaki | 327/156 |
| 2009/0024889 A1* | 1/2009 | Forrest et al. | 714/733 |
| 2009/0304054 A1* | 12/2009 | Tonietto et al. | 375/221 |

OTHER PUBLICATIONS

Texas Instruments, LVDS Owner's Manual 2008, pp. 20-21.*

* cited by examiner

*Primary Examiner* — Shuwang Liu
*Assistant Examiner* — Ross Varndell
(74) *Attorney, Agent, or Firm* — Ropes & Gray LLP; Jeffrey H. Ingerman

(57) ABSTRACT

The ability of clock and data recovery ("CDR") circuitry on an integrated circuit ("IC") to handle jitter in a serial data input signal can be tested by using transmitter circuitry on the IC to produce a serial data output signal whose time base has been subjected to modulation. Loop-back circuitry on the IC may be used to apply the serial data output signal to the CDR circuitry as the serial data input signal of the CDR circuitry. Modulation circuitry on the IC may be used to cause the above modulation of the time base of the serial data output signal.

10 Claims, 10 Drawing Sheets

TESTING PERFORMANCE OF CLOCK AND DATA RECOVERY CIRCUITRY ON AN INTEGRATED CIRCUIT DEVICE

BACKGROUND

This disclosure relates to integrated circuit devices ("ICs"), and more particularly to testing the performance of clock and data recovery ("CDR") circuitry on an IC.

Many different kinds of integrated circuits ("ICs") include clock and data recovery ("CDR") circuitry for use, for example, in receiving a high-speed serial data signal from other circuitry in a larger system that the IC is part of. The high-speed serial data signal that is applied to such CDr circuitry on an IC may combine both serial digital (e.g., binary) data information and the clock or timing information that is needed to determine when the serial data signal is representing each successive binary digit ("bit") of the data information. Typically this clock information is embodied in the timing of transitions between the binary levels of the serial data signal. In other words, there is no separate clock signal (having a predetermined phase relationship to the serial data signal) that accompanies the serial data signal. The serial data signal itself includes both the serial data information and the timing or clock information needed to recover the data information from the serial data signal.

CDR circuitry that receives a serial data signal of the type described above typically includes circuitry for recovering the clock or timing information from the serial data signal and producing a "recovered clock signal" embodying that recovered clock information. Such CDR circuitry typically also includes circuitry for using the recovered clock signal (or possibly a phase-shifted version of the recovered clock signal) to time sampling of the serial data signal at times that are optimal or nearly optimal for recovering successive data bits from the serial data signal. The thus-recovered serial data may be embodied in a so-called "retimed data signal" or "recovered data signal" output by the CDR circuitry.

As a somewhat more specific example of the foregoing, the CDR circuitry may be designed to attempt to sample the serial data signal as close as possible to the center of each unit interval ("UI") in the serial data signal. (The UI is the time period during which any one of the successive data bits is present in the serial data signal). In order to do this, the CDR circuitry may try to synchronize, as nearly as possible, the frequency and phase of transitions in the recovered clock signal with the frequency and phase of transitions in the serial data signal. This may be done, for example, by the CDR circuitry controllably changing the frequency and phase of the signal that it will use as the recovered clock signal. When the above-mentioned synchronization has been satisfactorily achieved, the CDR circuitry may use a sampling clock signal with a 90 degree phase shift from the recovered clock signal to sample the serial data signal concurrently with transitions in the sampling clock signal. These sampling clock signal transitions should be at or near the center of each successive UI in the serial data signal, thereby producing the desired optimal or near optimal sampling of the serial data signal for the most reliable (i.e., most nearly data-error-free) recovery of the data information. Sampling at or near the center of UIs is typically best because that is the location along each UI that is most distant (in time) from possible changes (transitions) in the level of the serial data signal (due to possible need of that signal to represent a preceding or succeeding data bit having a different binary value (1 or 0) than the current bit). This reduces (preferably to a minimum) the risk that a sample will be erroneous due to effects from a transition in the serial data signal.

In actual use of an IC in a larger system, a serial data signal applied to the IC is rarely, if ever, completely "clean," i.e., free from noise, attenuation of at least some frequency components, timing instability, etc. Moreover, even nominally identical ICs may have some variation in the ability of their CDR circuitry to tolerate such imperfections in a received serial data signal. For example even ICs that have been manufactured to be the same may have some such CDR variations due, e.g., to variations in the manufacturing process from one semiconductor wafer to the next semiconductor wafer or the like. ICs with greater tolerance for serial data signal imperfections may be referred to as having a greater CDR performance margin and may be saleable at a higher price than otherwise similar ICs with less tolerance for such imperfections. This can contribute to a need for efficient ways to test the CDR performance margin of ICs.

SUMMARY

In accordance with certain possible aspects of the disclosure, an integrated circuit ("IC") may include transmitter circuitry for producing a serial data output signal having a modulated time base. By this it is meant that the timing of successive data bits in the output signal is deliberately varied (changed, modulated) over time as the signal is output. For example, this timing (time base) variation (modulation) may be cyclical with a particular frequency or with controllably variable or controllably selectable frequency. Alternatively or in addition, this timing (time base) variation (modulation) may have a particular amplitude or a controllably variable or controllably selectable amplitude. The time base of the serial data output signal may be modulated by modulating the phase or frequency of the clock signal whose pulses or transitions are used to time the output of successive data bits in the serial data output signal. Loop-back circuitry on the IC may be used to apply the above serial data output signal to clock and data recovery ("CDR") circuitry on the IC when it is desired to test the performance margin of the CDR circuitry. The ability of the CDR circuitry to correctly recover data from this looped-back serial data signal (despite the above-described deliberate modulation of the time base of that signal) determines the performance margin of the CDR circuitry.

In non-test mode, the transmitter circuitry can be operated without modulation of the time base of the serial data output signal it produces. If desired, this non-test-mode operation of the transmitter circuitry may include use of a fixed amount of the type of clock signal phase shift that (when modulated) is used during test mode. For example, this fixed amount of phase shift may be determined (selected from several possible different amounts) by programmable control circuitry on the IC.

In accordance with other possible aspects of the disclosure, a method for testing the performance margin of CDR circuitry on an IC may include using transmitter circuitry on the IC to produce a serial data output signal having a modulated time base. This serial data output signal may be applied to the CDR circuitry as a serial data input signal. The ability of the CDR circuitry to correctly recover data from this serial data input signal (despite the above-mentioned modulation of the time base of that signal) determines the performance margin of the CDR circuitry. For example, such testing may include comparing the data recovered by the CDR circuitry to the data that the transmitter circuitry included in the serial data output signal. If these compared data are the same, the CDR cuircuit's performance margin is adequate for the amount of time-base modulation that the serial data output signal has been given. If these compared data are not completely the same, the CDR's performance margin is not adequate for this amount of time-base modulation. Such testing may further include successively employing several different levels (amounts, degrees, kinds) of modulation of the time base of the serial data output signal to determine the level of modulation (if any) at which the CDR circuitry can no longer reliably recover data from the signal it receives.

Further features of the disclosure, its nature and various advantages, will be more apparent from the accompany drawings and the following detailed description.

DETAILED DESCRIPTION

Figure 1:
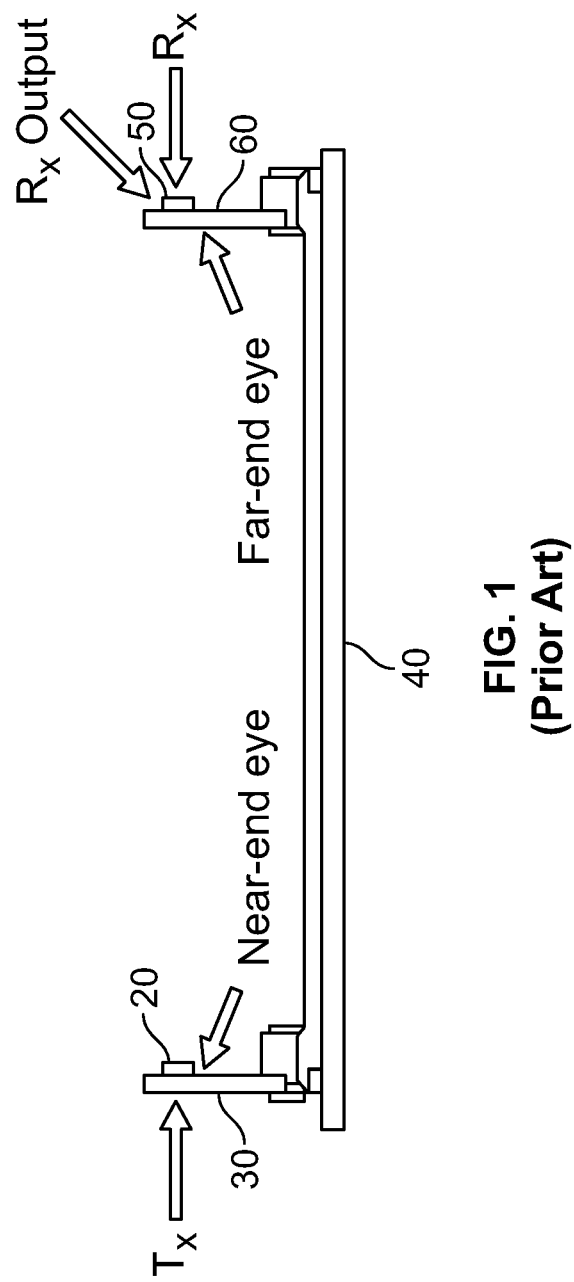
FIG. 1 is a simplified elevational view of a typical system that may include ICs that can communicate with one another via one or more high-speed serial data signals.

FIG. 1 shows an example of a system 10 that may employ a first IC 20 mounted on a first printed circuit board ("PCB") 30, which in turn is mounted on back-plane ("BP") circuit structure 40. A second IC 50 is mounted on a second PCB 60, which is also mounted on BP 40 at some distance from PCB 30. Illustratively, IC 20 includes transmitter ("TX") circuitry for sending a high-speed serial data signal to IC 50 via circuitry on PCB 30, BP 40, and PCB 60. IC 50 includes receiver ("RX") CDR circuitry for receiving this high-speed serial data signal and recovering from it clock (timing) information and data information as described in general terms in the Background section of this specification.

Figure 2:
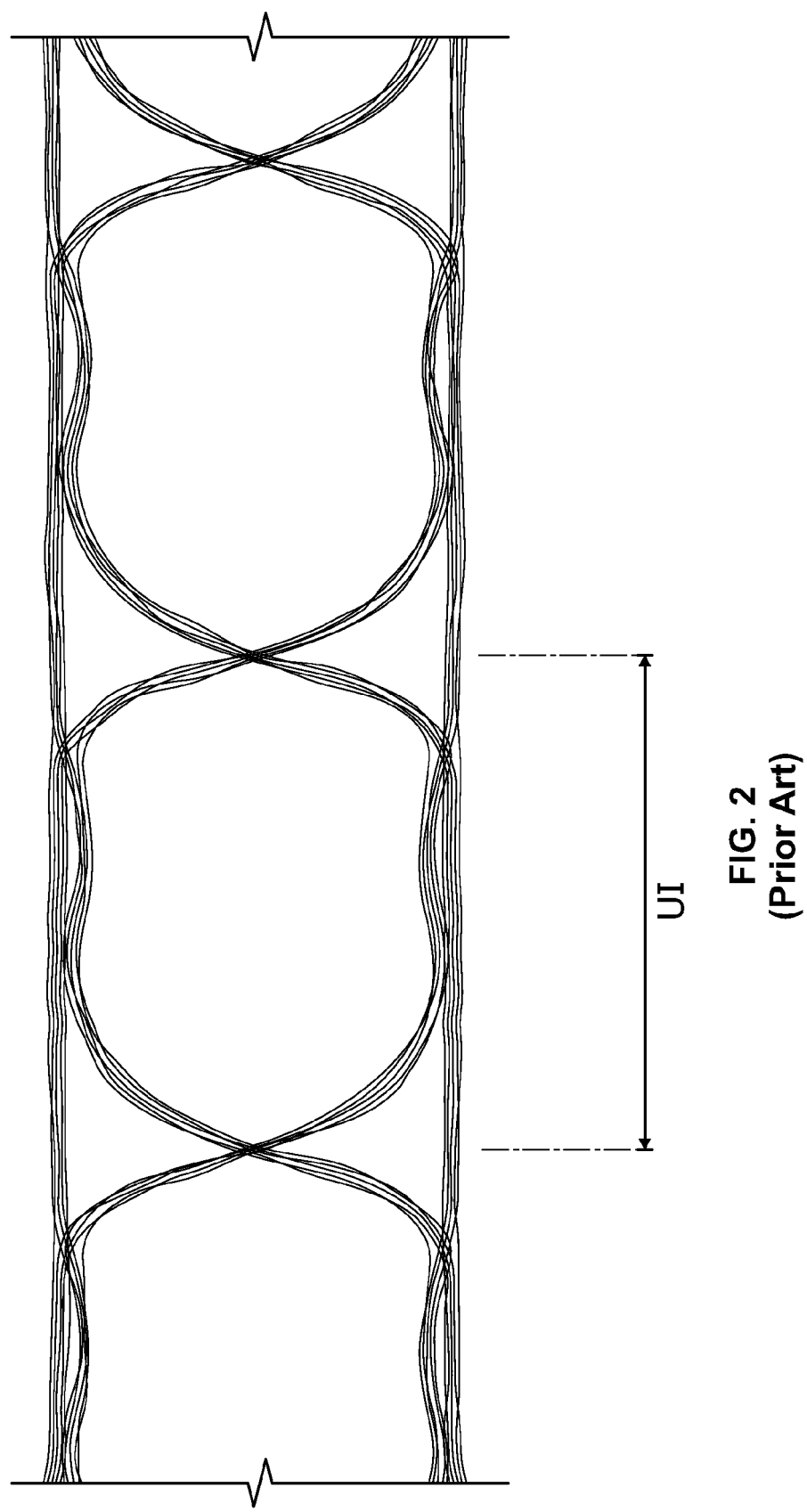
FIG. 2 is a simplified diagram of super-imposed portions of a typical high-speed serial data signal at the FIG. 1 circuit component that is transmitting that signal.

FIG. 2 shows representative portions of a trace of the high-speed serial data signal as it is produced by TX IC 20. FIG. 2 may show the signal as having two, complementary, constituent signals collectively, a so-called differential signal). As is conventional for such a signal, one of the constituent signals has the higher of its two possible (binary, digital) signal levels concurrently with the other constituent signal having the lower of its two possible (binary, digital) signal levels. FIG. 2 traces both constituents of such a differential signal. (Moreover, FIG. 2 traces several succeeding portions of the TX signal over the same field of view visible in FIG. 2.) The boundaries of one representative UI in the serial data signal are delineated in FIG. 2. (Again, a UI is the minimum elapsed time between two successive transitions in the serial data signal.)

It will be noted that the TX signal shown in FIG. 2 is quite "clean" and has a large open "eye" in each UI. (The eye of a signal like that shown in FIG. 1 is the portion of a UI that is bounded (i.e., not traversed) by any portion of either of the complementary constituents of the signal.) As a general rule, the larger the eye of such a high-speed serial data signal, the more easily and more reliably CDR circuitry can recover clock and data information from that signal.

(Although a complementary signal has two constituent signal components, it is customary to sometimes refer to such a signal using the singular noun "signal" or the singular phrase "differential signal," and that will often be done in this disclosure. Also, it is not necessary for the high-speed serial data signal(s) discussed herein to be differential. Such a signal can alternatively be a single-ended signal (one constituent signal only). Such a single-ended signal can still be described as having a UI and an eye.)

Figure 3:
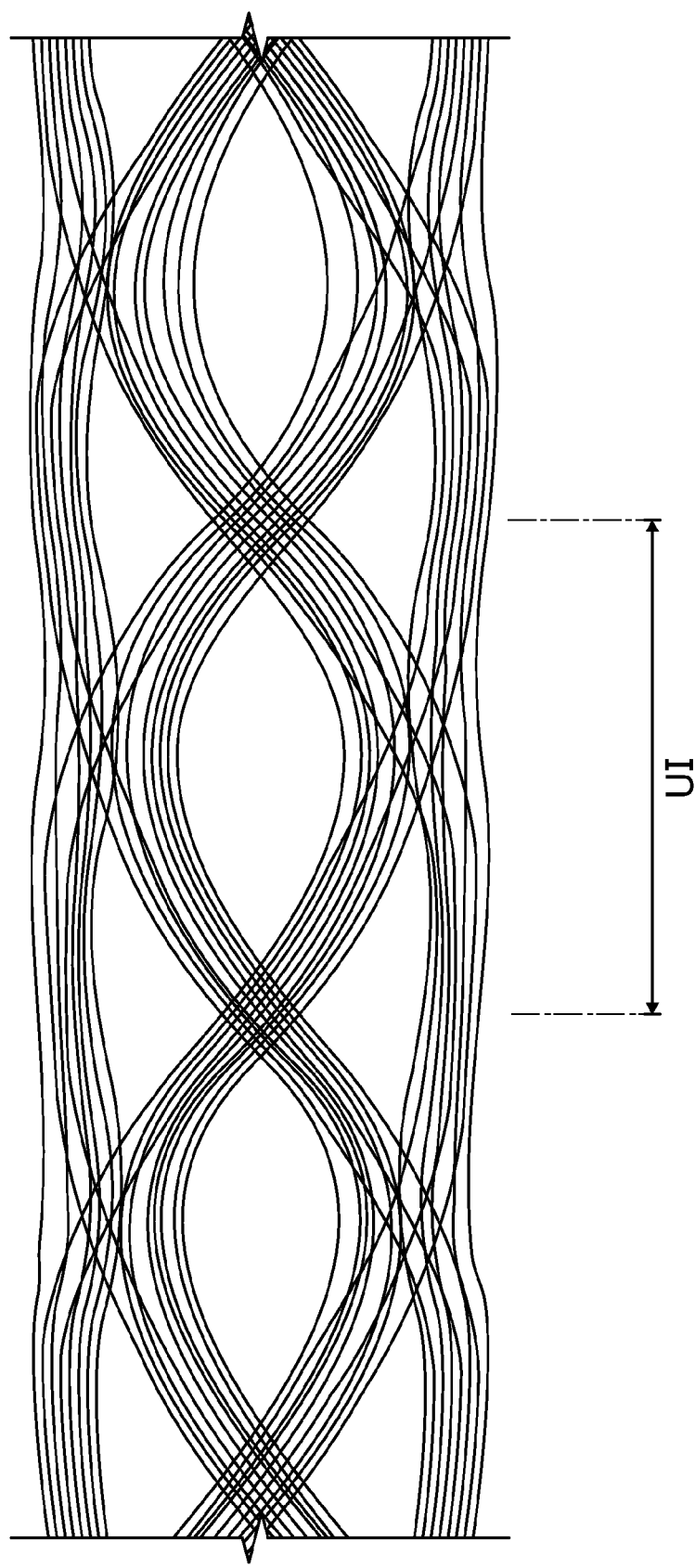
FIG. 3 is a simplified diagram of signal information like that shown in FIG. 2 at the FIG. 1 circuit component that receives that information.

FIG. 3 shows an example of how the FIG. 2 signal may trace when it reaches the CDR in RX IC 50 in FIG. 1, i.e., after the signal has passed through all the circuitry 30, 40, and 60 that conveys it from TX IC 20 to RX IC 50. As FIG. 3 shows, the received signal is typically not nearly as "clean" as it was when it started out at TX IC 20. (Again, a representative UI is delineated in FIG. 3.) For example, all portions of the signal trace in FIG. 3 are more "spread out" or diffuse than in FIG. 2, and the eye in each UI is not nearly as large, either in width (along the horizontal time axis) or height (along the vertical voltage axis). It is therefore more difficult for CDR circuitry in RX IC 50 to accurately and reliably recover clock and (especially) data information from a signal having the FIG. 3 condition than it would be from a "cleaner" signal more like that shown in FIG. 2.

Figure 4:
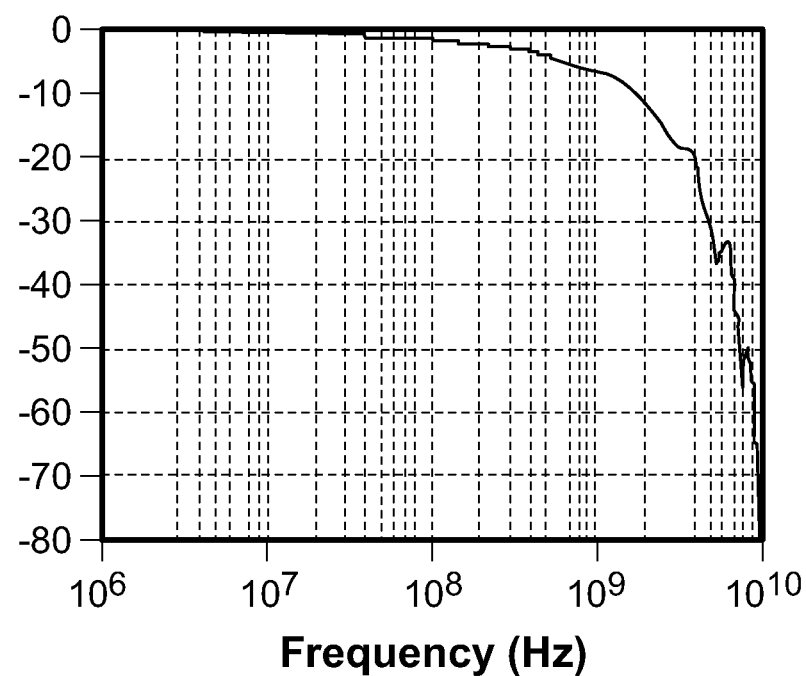
FIG. 4 is a simplified diagram of typical frequency response of circuitry of the type shown in FIG. 1.

FIG. 4 shows the typical frequency response (i.e., signal attenuation as a function of frequency) of circuitry like that shown in FIG. 1 for connecting TX IC 20 to RX IC 50. As FIG. 4 shows, above about 1 gigahertx (1.0 GHz, where the horizontal frequency axis in FIG. 4 is marked 10 to the ninth power), signal attenuation begins to become greater and greater as frequency continues to increase. This is an example of a factor that can contribute to the kind of signal degradation that is illustrated by FIG. 3 as compared to FIG. 2.

As mentioned in the Background section of this specification, it can be desirable to be able to test the ability of an IC (i.e., the CDR circuitry of the IC) to correctly recover data from a received high-speed serial data signal with one or more different degrees (amounts) of signal degradation as illustrated by FIG. 3. For example, an IC that has a higher tolerance for such degradation may be referred to as having a higher transceiver CDR performance margin and may be saleable at a higher price than an otherwise similar IC that does not have such a high CDR performance margin. One way that the CDR performance margin of an IC can be tested is to mount the IC on a PCB board (e.g., in a system like that shown in FIG. 1). Then a signal transmitted to the IC can be degraded by external channel losses in order to degrade the signal at the (RX) IC's input. The channel acts as a low frequency filter which attenuates high frequency components of the signal, thereby leading to an increase in data-dependent jitter. Such jitter manifests itself by diffusing the trace of the received signal as shown in FIG. 3 (as compared to FIG. 2). The bandwidth of the channel dictates the magnitude of bounded timing jitter the receiver IC sees.

The immediately above-described procedure can be used as a test methodology for characterizing the amount of tolerable noise (eye closure) that the RX IC CDR can tolerate while still maintaining acceptable data integrity. However, while this type of test methodology may be suitable for custom characterization testing, it does not provide the performance throughput required to efficiently quantify CDR performance margins during silicon production testing.

In contrast to the foregoing, the present disclosure allows for the intrinsic evaluation of the performance margin of a CDR circuit on an IC without requiring external degradation of a transmitted signal. An implementation in accordance with this disclosure may have any or all of the following attributes: (1) provide the ability to modulate the timing internally on the transmitter's path; (2) allow the magnitude of timing noise to be controllable and configurable on the fly; (3) remove the requirement to degrade the signal external to the chip; (4) avoid any impact on performance of the IC's transceiver during normal operation of the IC; and (5) provide an implementation that is small enough so that it only requires minimal circuit "real estate" (area) on the IC.

In accordance with certain possible aspects of the disclosure, a selectable high-speed programmable phase shifter (clock modulator) circuit may be included in the clock path within the transmitter circuitry of an IC. When enabled, this phase shifter can inject timing jitter into a high-speed serial data signal output by the transmitter. This is accomplished by modulating the high-speed clock (used by the transmitter to control when successive data bits are output) at a rate and/or by an amount that may be controllable by the user (or tester) of the IC. For example, the rate at which the clock modulates may be user-defined and based on the toggle rate of control bits applied to the modulator. Preferably, this allows the user to modulate the clock at rates higher than the bandwidth of the CDR to avoid being tracked by the CDR. A loop-back connection (e.g., on the IC) may be used to apply the high-speed serial data signal output by the transmitter to the CDR circuitry on the IC that is to be tested. An illustrative embodiment of the just-described circuitry is shown in FIG. 5.

Figure 5:
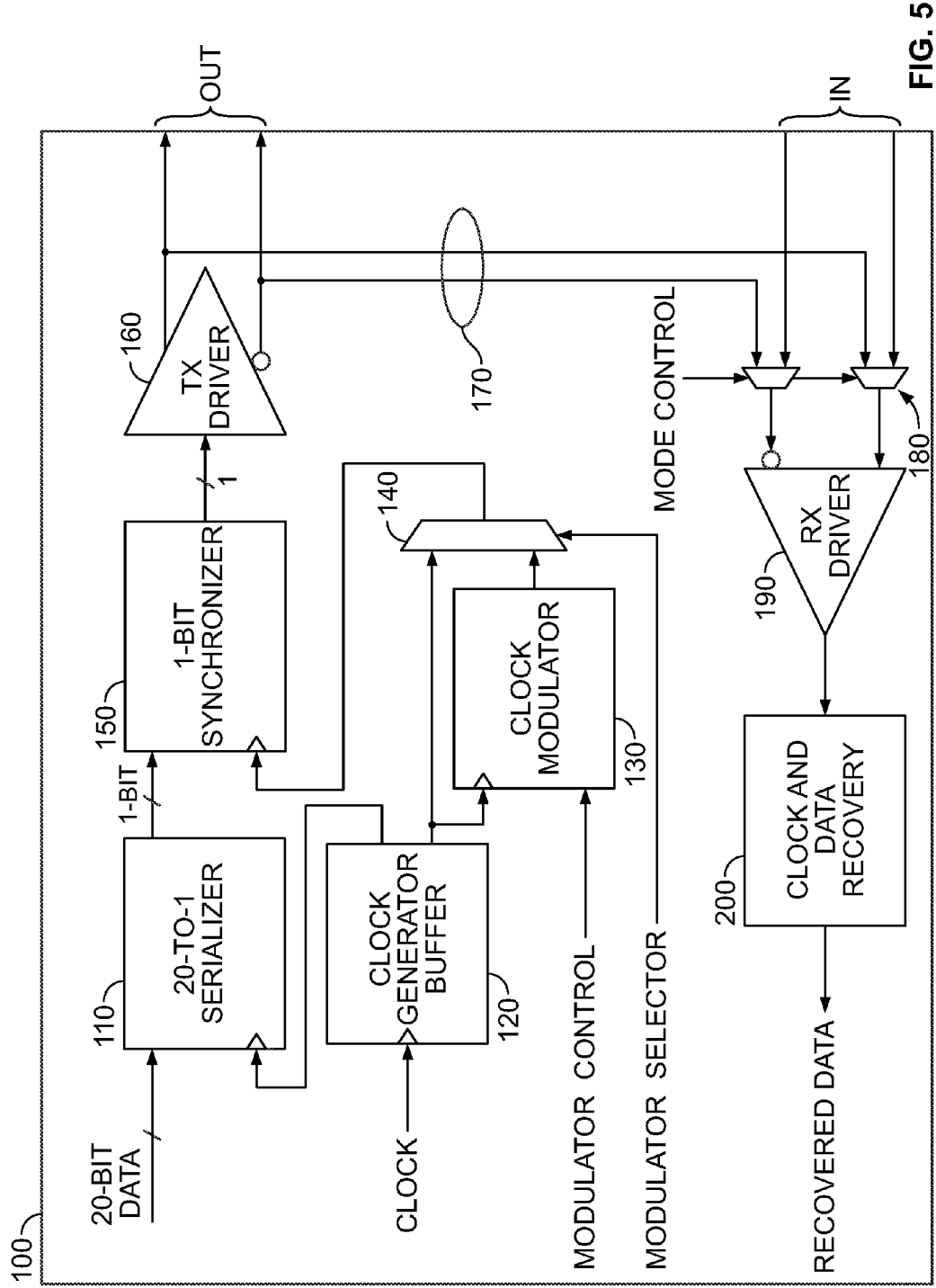
FIG. 5 is a simplified schematic block diagram of an illustrative embodiment of circuitry in accordance with certain possible aspects of the disclosure.

As shown in FIG. 5, an illustrative embodiment of an IC 100 in accordance with certain possible aspects of the disclosure includes transceiver circuitry, which in turn includes transmitter circuitry (in the upper portion of the FIG.) and receiver circuitry (in the lower portion of the FIG.). For example, the transmitter circuitry may receive successive words of parallel data, e.g., from (or via) other circuitry on the IC. FIG. 5 shows this data being applied 20 parallel bits at a time. Stated another way, each of the above-mentioned words includes 20 parallel data bits. These parallel data words are applied to 20-to-1 serializer circuitry 110.

The transmitter circuitry being described also receives a clock signal (e.g., from (or via) other circuitry on the IC). This clock signal is applied to clock generator buffer circuitry 120. Circuitry 120 outputs what may be referred to as a low-speed clock signal that is applied to serializer 110. This low-speed clock signal clocks each successive 20-bit parallel data word into the parallel data input side of serializer 110. Circuitry 120 also outputs what may be referred to as a high-speed clock signal that is applied to clock modulator circuit 130 and also to one of the selectable inputs to multiplexer circuitry ("mux") 140. Although not shown in FIG. 5, the high-speed clock signal output by circuitry 120 (or a phase-shifted version of that signal) may also be applied to the serial output side of serializer 110 to cause serializer 110 to output each bit of each 20-bit data word one bit at a time, one bit after another in succession. Thus (in this particular embodiment) the frequency of the high-speed clock signal is typically 20 times the frequency of the low-speed clock. An alternative term for the high-speed clock may therefore be "bit-rate clock" because its frequency corresponds to the serial data rate of the bits in the high-speed serial data signal that the transmitter circuitry produces as an output. An alternative term for the low-speed clock may be "word-rate clock" because its frequency corresponds to the rate at which parallel data words are taken in by serializer 110 (and, of course, also output in serial form in the high-speed serial data signal).

It is emphasized that the use of 20-bit data words is only an example, and that circuitry in accordance with this disclosure may be constructed to operate on data words having any number of bits (e.g., 8 bits, 10 bits, 16 bits, 24 bits, 32 bits, etc.).

In most instances of normal use of the FIG. 5 circuitry, mux 140 is controlled by the logical state of its selection control input signal ("modulator selector") to select the high-speed clock signal output by circuitry 120 to be its (mux) output signal. The output signal of mux 140 $Is$ applied to the clock input of 1-bit synchronizer circuit 150, whose other (data) input is the serial data signal output by serializer 110. Circuitry 150 controls the actual timing of when each successive serial data bit output by circuitry 110 is applied to TX driver circuitry 160. When the circuitry is being operated as described in this paragraph (i.e., to apply the high-speed clock from circuitry 120 to circuitry 150 without use of clock modulator circuitry 130), the timing with which circuitry 150 applies successive serial data bits to TX driver 160 will be highly regular (constant), causing TX driver 160 to produce a "clean" high-speed serial data output signal such as is illustrated by FIG. 2. IC 100 can output this signal via its high-speed serial data signal output leads "OUT".

On the other hand, when it is desired to test the performance margin of CDR circuitry 200 on IC 100, clock modulator circuitry 130 may be used as will now be described.

Clock modulator circuitry 130 may be any circuitry that is able to shift (modulate) the phase of an output high-speed clock signal relative to the phase of the high-speed clock signal that circuitry 130 receives from circuitry 120. For example, circuitry 130 may be able to control the amount (magnitude, amplitude) by which the phase of its output signal is shifted relative to the phase of its input signal. Alternatively, circuitry 130 may be able to control the rate (frequency) at which its output signal shifts in phase relative to its input signal. As still another example, circuitry 130 may be able to control both the amount of phase shift and the rate (frequency) of phase shift change of its output relative to its input. Some or all of the phase shift parameters that circuitry 130 implements may be hard-wired into circuitry 130. Alternatively or in addition, some or all of these phase shift parameters may come from or be selected by the "modulator control" signals that are applied to circuitry 130 (e.g., from one or more sources external to IC 100 and/or from other circuitry on IC 100). In the immediately following discussion it will generally be assumed that circuitry 130 is modulating its output signal phase (i.e., causing that output signal phase to fluctuate in a cyclical fashion) at a rate (frequency) that is greater than the ability of CDR circuitry 200 to fully track (match) that fluctuation with its recovered clock signal.

Figure 6:
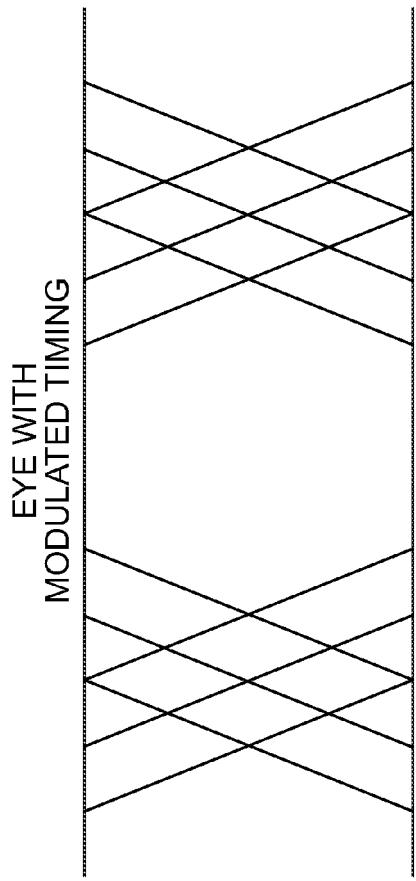
FIG. 6 is a simplified diagram showing an example of a signal that can be produced by FIG. 5 type circuitry in accordance with certain possible aspects of the disclosure.

The output signal of circuitry 130 is applied to the second selectable input to mux 140. The "modulator selector" signal is controlled to cause mux 140 to output the fluctuating-phase, high-speed clock signal from circuitry 130 (rather than the constant-phase, high-speed clock signal that comes directly from circuitry 120). Because circuitry 150 now receives this fluctuating-phase clock signal, circuitry 150 outputs successive serial data signal bits with correspondingly fluctuating phase (timing). The eye of this type of data output from circuitry 150 (and hence from TX driver 160) is illustrated by FIG. 6. Note that FIG. 6 is a somewhat diffuse signal trace like FIG. 3. In other words, FIG. 6 shows a signal to which jitter has been deliberately added.

In this mode of operation, loop-back connections 170 from the outputs of TX driver circuitry 160, through muxes 180 and RX driver 190, are used to apply the high-speed serial data signal output by the TX circuitry to CDR circuitry 200. This loop-back routing is preferably all provided on IC 200. While the IC is in this mode of operation, a "mode control" signal controls muxes 180 to output their lead 170 inputs, rather than their inputs ("IN") that can be used for a high-speed serial data signal from a source external to IC 100. (Inputs "IN" are typically used to receive an external high-speed serial data signal when IC 100 is in normal use in a larger system. When operating in such a "normal" mode, the "mode control" signal causes muxes 180 to connect the "IN" terminals to RX driver 190, thereby disconnecting or disabling loop-back connections 170 on IC 100.)

Returning to the test mode being described, CDR circuitry 200 is operated to attempt to recover from the loop-back, high-speed, serial data signal from TX driver 160 the data that was included in that signal by the circuitry upstream from the TX driver. Thus, for example, the data that CDR circuitry 200 recovers from the signal it receives may be compared to the data that went into serializer 110. If the recovered data is the same as the starting data, CDR 200 has been shown to be able to operate with the frequency and magnitude of jitter that circuitry 130 has introduced into the high-speed serial data signal. On the other hand, if there are differences between the recovered data from CDR 200 and the starting data that went into circuitry 110, it has been shown that CDR cannot recover error-free data from a high-speed serial data signal having the amount of jitter that circuitry 130 has caused.

If multiple levels of possible CDR performance margin are of interest, circuitry 130 may be operated (for example) to produce jitter of increasing frequency and/or increasing amplitude until the point along such a jitter scale or progression is reached at which CDR 200 can no longer recover error-free data. This determines the limit of the CDR performance margin of that particular CDR 200.

Figure 7:
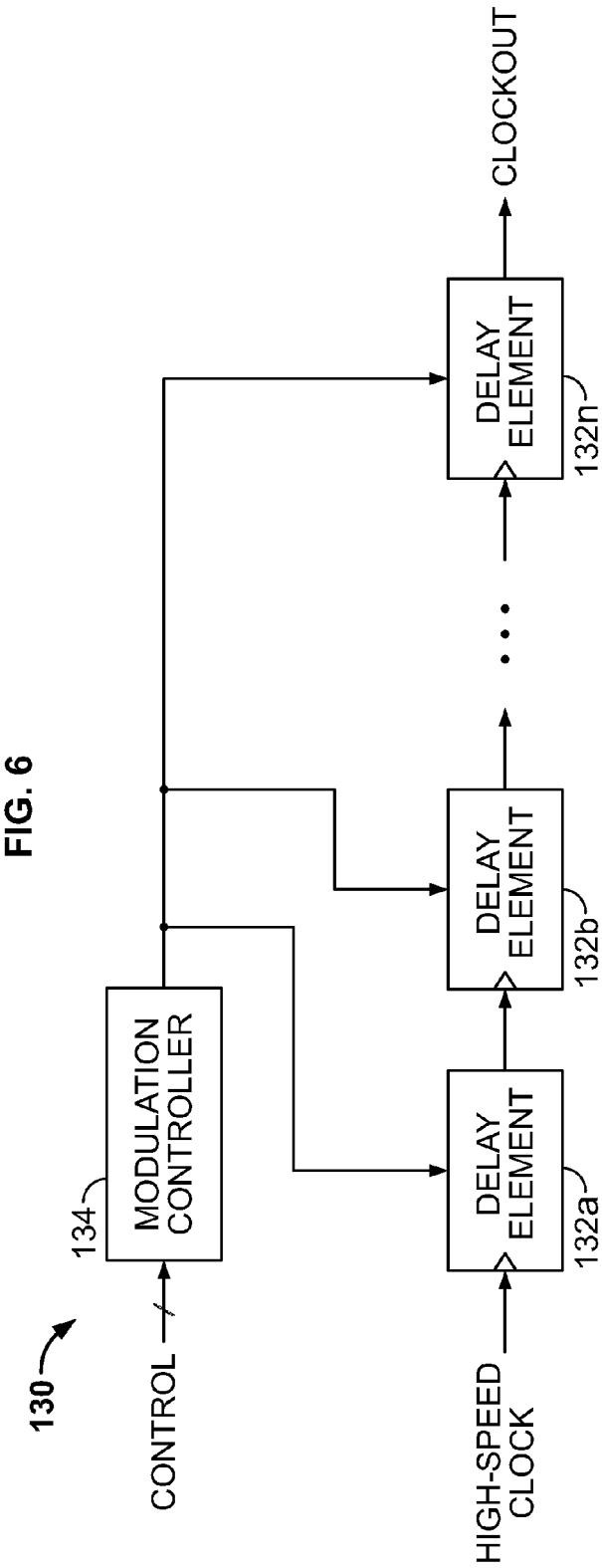
FIG. 7 is a simplified schematic block diagram of an illustrative embodiment of a portion of FIG. 5 type circuitry in accordance with certain possible aspects of the disclosure.

An illustrative embodiment of clock modulator circuitry 130 is shown in more detail in FIG. 7. (It will be understood that the FIG. 7 embodiment is only one possible way that circuitry 130 can be constructed. Other possible constructions for circuitry 130 will readily occur or be apparent to those skilled in the art.) In the embodiment shown in FIG. 7, the high-speed clock signal from circuitry 120 is passed successively through a series of delay circuit elements 132a, 132b, 132c, etc. The output signal of the final one of these delay circuit elements (132n) is the fluctuating-phase (or modulated-phase) high-speed output clock signal of circuitry 130. Each of delay elements 132 receives a delay control signal from modulation controller circuitry 134. This delay control signal determines the amount of delay that each delay element 132 gives to the signal passing through it. The range over which the delay control signal varies determines the amplitude (maximum amount) of the phase shift modulation. The rate (frequency) of variation (e.g., cyclical variation) of the delay control signal determines the frequency of the phase shift modulation. Parameters such as these modulation amplitude and modulation frequency parameters can be wholly or partly hand-wired into circuitry 134. Alternatively or in addition, these parameters can be wholly or partly supplied to circuitry 134 (or selected from various options hard-wired into circuitry 134) by the "control" signals that are applied to circuitry 134 as shown in FIG. 7. For example, some or all of these "control" signals can come from one or more sources external to IC 100.

Note that although all of elements 132 in FIG. 7 are "delay" elements, the circuitry can effectively either advance or delay the phase of its output signal relative to the input high-speed clock signal. For example, if some intermediate amount of delay by each of elements 132 causes the entire series of such elements to delay the input clock signal by one full cycle (360 degrees), then less than that "intermediate amount of delay" will have the apparent effect of advancing the phase of the CLOCKOUT signal relative to the input clock signal. Similarly, more than that "intermediate amount of delay" will have the apparent effect of delaying (retarding) the phase of the CLOCKOUT signal relative to the input clock signal. The circuitry is therefore capable of providing jitter that is symmetrical about the mid-point of a no-jitter data signal eye if that is desired.

Figure 8:
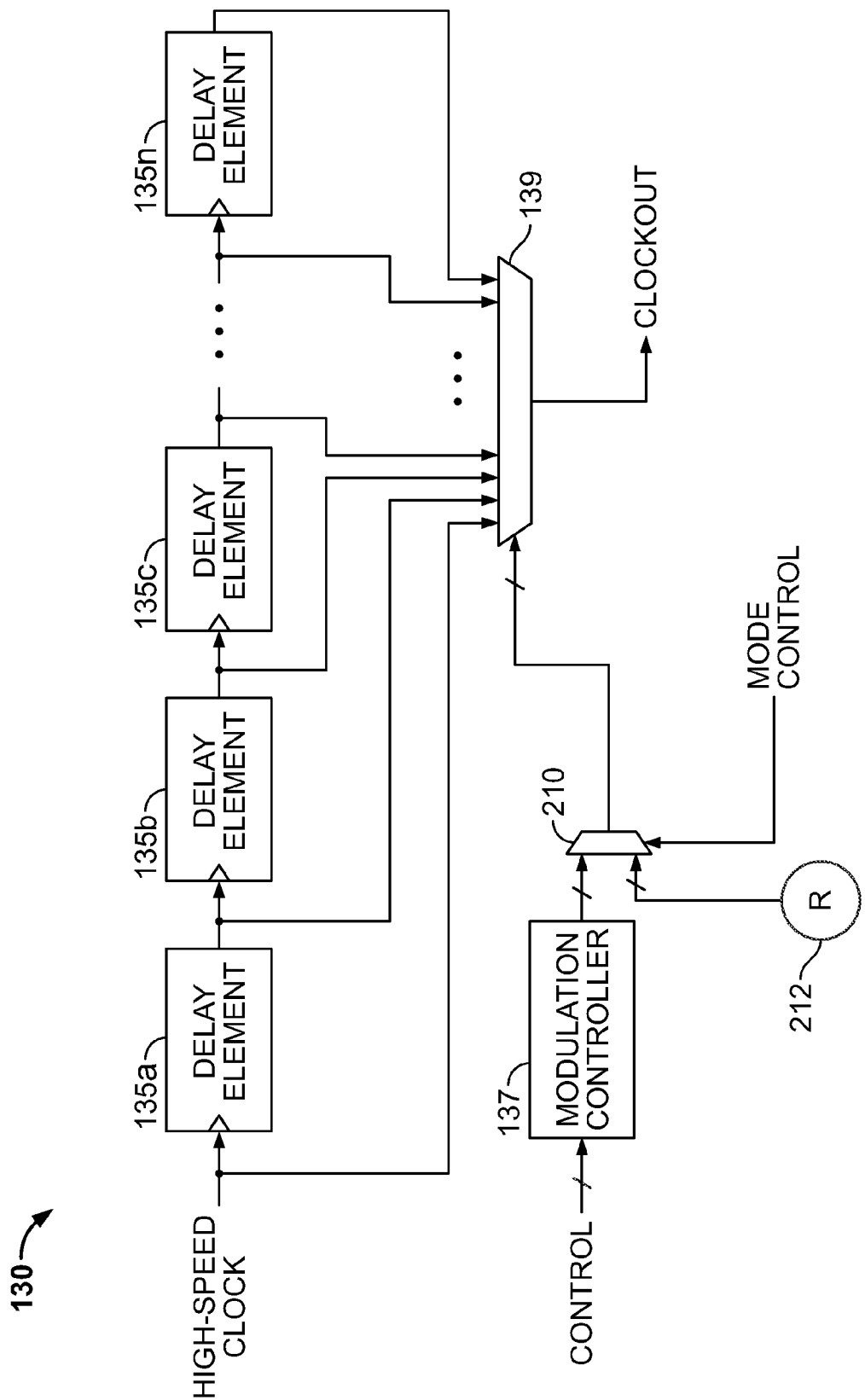
FIG. 8 is a simplified schematic block diagram of an illustrative embodiment of a possible alternative to what is shown in FIG. 7.

Another example of how clock modulator circuitry may be constructed is shown in FIG. 8. In this embodiment the high-speed clock signal from circuitry 120 is passed through a series of delay circuit elements 135a-n, each of which gives the signal passing through it a fixed amount of delay (and thereby a fixed amount of phase shift or additional phase shift relative to the input clock signal). (Different ones of elements 135a-n can have different amounts of delay, if desired; but for simplicity in this discussion it will generally be assumed that each of elements 135 has the same amount of delay.) Each of the input signal to element 135a and the output signal of each of elements 135a-n is applied to a respective one of the selectable inputs to mux 139. The selection of which one of its selectable inputs mux 139 outputs at any given time is controlled by the outputs of mux 210 (which mux 210 outputs are applied to the selection control inputs of mux 139). Mux 210 is controlled (by a mode control signal applied to its selection control input) to output either (1) the output signals of modulation controller circuitry 137, or (2) the output signals of memory circuitry 212 on the IC.

Considering first the (1) option above, modulation controller 137 can output signals for causing mux 139 to make different selections from its selectable inputs at different times, thereby modulating the phase of the CLOCKOUT signal relative to the phase of the starting high-speed clock input signal. As noted elsewhere throughout this disclosure, this modulation can be cyclically repeating (e.g., by modulation controller 137 repeatedly stepping through the same sequence of different mux 139 selections, which may, for example, first gradually increase the number of delay elements 135 that are actually used in providing CLOCKOUT, then gradually reducing that number, then again gradually increasing that number, and so on). Alternatively, the cyclical repetition may be a cyclical repetition of a more random ordering of the selectable inputs to mux 139. As still another example, the selection made by mux 139 may be even more random, e.g., with no definite cyclical repetition. Also, as noted elsewhere throughout this disclosure, the range of selected elements 135 may be controlled (or changed) to control (or change) the amplitude of the modulation of CLOCKOUT. For example, a relatively small amplitude of modulation may be implemented by circuitry 137 controlling mux 139 to select from among only outputs of delay elements 135a-f. In contrast, a larger amplitude of modulation may be implemented by circuitry 137 controlling mux 139 to select from among only outputs of delay elements 135a-i. A still larger amplitude of modulation may be implemented by circuitry 137 controlling mux 139 to select outputs of any of delay elements 135a-n. Still further, as noted elsewhere throughout this disclosure, the frequency (rate) of the modulation of CLOCKOUT may be controlled (or changed) by circuitry 137 controlling (or changing) the rate at which mux 139 makes different selections from its various selectable inputs. The control signals applied to circuitry 137 may partly or wholly control these modulation amplitude and/or frequency aspects of the operation of circuitry 137. Alternatively or in addition, some aspects of these modulation control parameters may be hard-wired into circuitry 137.

Returning now to the most recently above-mentioned option (2) that can be implemented by element 210 in cooperation with elements 212: This is an example of how circuitry 130 can be used (in conjunction with element 140) to introduce a selectable but typically fixed amount of phase shift into the clock signal applied to circuitry 150 during normal operation of the IC if that is found to be desirable. For example, elements 212 may be programmable memory circuit elements on the IC such as fuses, anti-fuses, metal-optional-links, configuration random-access memory ("CRAM"), or the like. This is typically part of a normal (not test) mode of operation of the IC. This feature can be used if for any reason it is found desirable to use a phase-shifted clock signal (rather than the nominally not phase-shifted, high-speed clock signal that is output by circuitry 120) for application to 1-bit synchronizer circuitry 150. If that is desired to be done, then (a) elements 212 are programmed to cause mux 139 to select the desired amount of clock phase shift, (b) the mode control signal in FIG. 8 causes mux 210 to apply signals 212 to the selection control inputs of mux 139, and (c) the modulator selector control signal in FIG. 5 causes mux 140 to select the CLOCKOUT signal of circuitry 130 for application to 1-bit synchronizer 150.

Although the just-described programmably selectable, fixed, clock phase shift feature has been illustrated in the context of FIG. 8, it will be understood that this same feature can be implemented in a similar or analogous way for any embodiment of clock modulator circuitry 130. For example, this feature can be implemented in the FIG. 7 embodiment of circuitry 130 by providing programmable elements like 212 for specifying (as an alternative to modulated control signals from circuitry 134) a particular fixed amount of delay that elements 132 will give to CLOCKOUT relative to the high-speed clock signal.

Figure 9A:
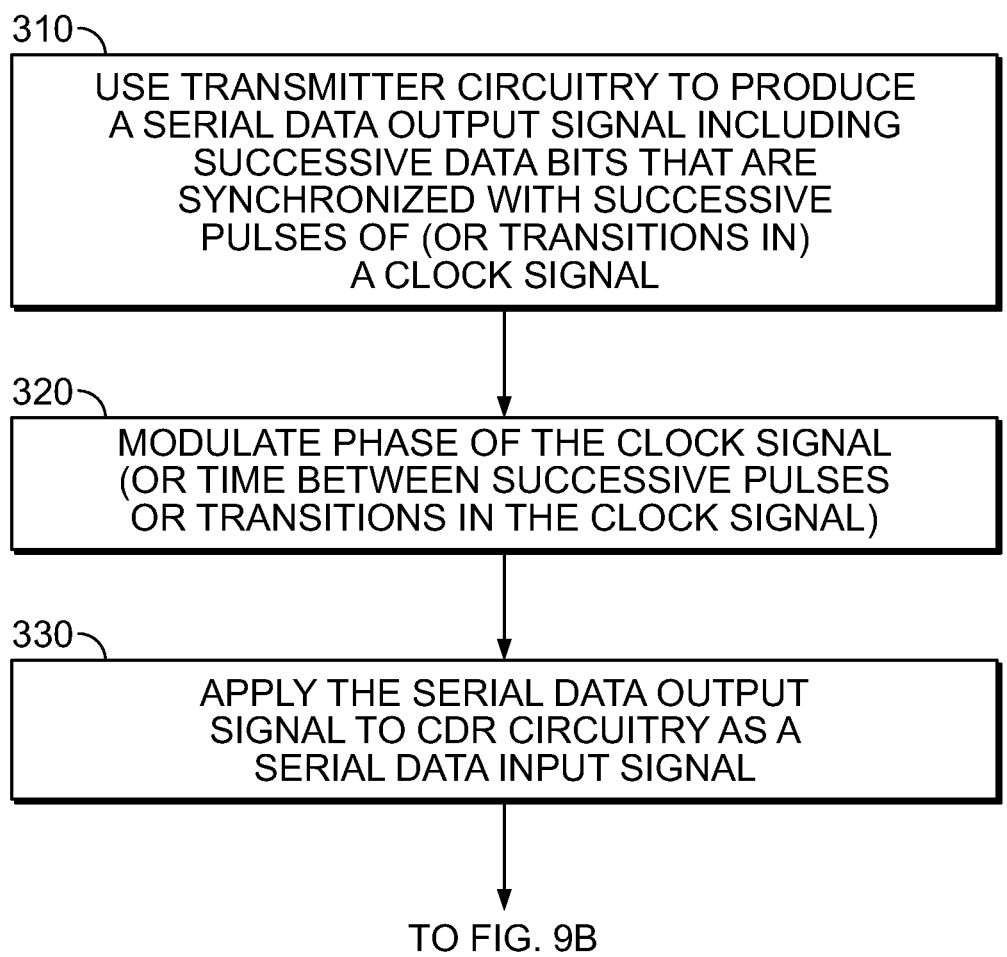
FIGS. 9a and 9b (sometimes referred to collectively as FIG. 9) are a simplified flow chart of illustrative methods in accordance with certain possible aspects of the disclosure.
Figure 9B:
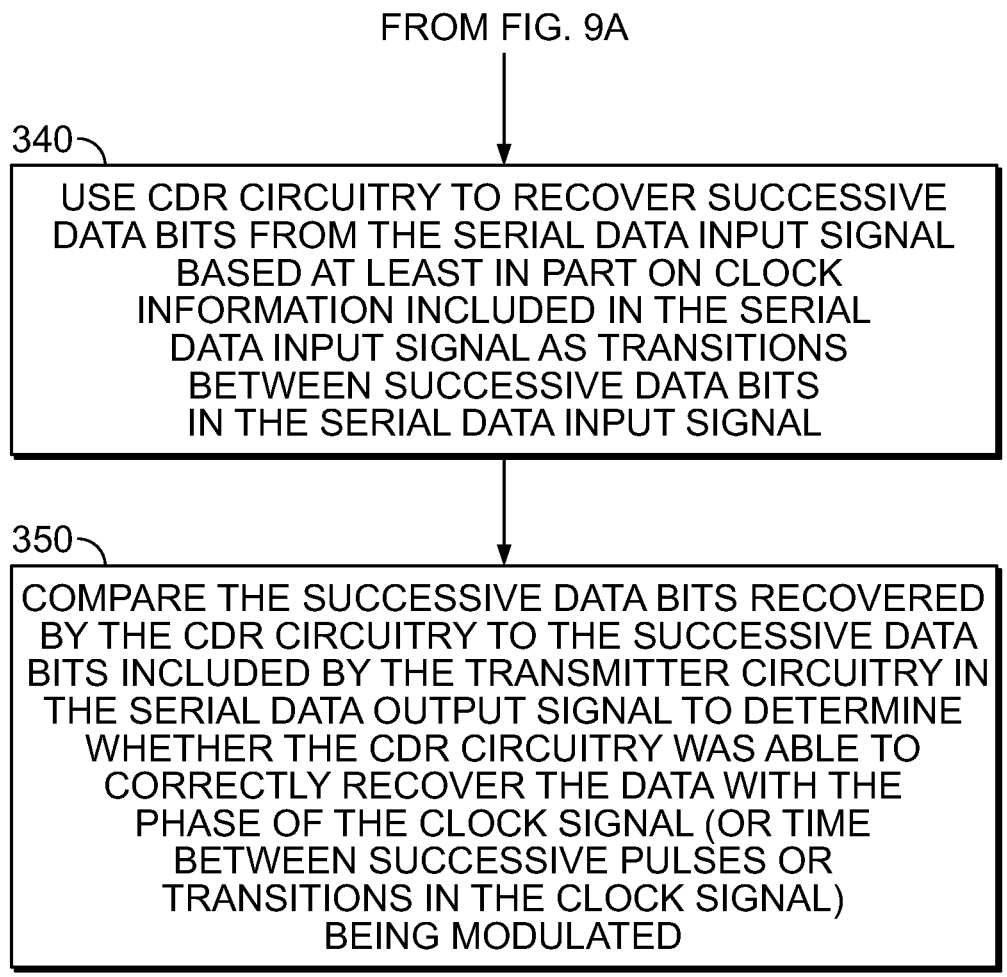

Other possible aspects of this disclosure relate to methods for operating IC circuitry (e.g., of the type shown in FIGS. 5, 7, and 8) in order to perform or provide on-chip testing of CDR circuitry on the IC. An illustrative embodiment of such methods will now be explained with reference to FIGS. 9a and 9b (sometimes referred to collectively as FIG. 9).

At 310, transmitter circuitry (e.g., elements 110, 120, 130, 140, 150, 160) is used to produce a serial data output signal that includes successive data bits that are synchronized with successive pulses of (or transitions in) a clock signal (e.g., from element 130). For example, 1-bit synchronizer 150 may make each successive data bit available as an output in synchronism with each successive rising edge (transition) or each positive-going pulse in the clock signal applied to it. Element 320 indicates that element 130 modulates the phase of this clock signal. Another way to state this is to say that element 130 modulates the amount of time between successive pulses or transitions in the clock signal. Still another way to say this is that element 130 modulates the frequency of the CLOCKOUT signal. As used throughout this disclosure, "modulate" or the like (e.g., "modulation," "modulating") refers to changing frequency, phase shift, elapsed time between pulses or transitions, or the like, over the course of time. Such modulation may be cyclical (a change that occurs repeatedly over time) or random. Such modulation may have a particular or changing frequency, and/or it may have a particular or changing amplitude.

At 330 the serial data output signal from 310 and 320 may be applied to the CDR circuitry (e.g., 200) as a serial data input signal. This may be done via loop-back circuitry (e.g., 170) on the IC.

At 340 the CDR circuitry may be used to recover successive data bits from the serial data input signal. As is conventional for CDR circuitry, this may be done based at least in part on clock information included in the serial data input signal as transitions between successive data bits in that signal.

At 350 the successive data bits recovered by the CDR circuitry may be compared to the successive data bits included in the serial data signal output by the transmitter circuitry. This can be done to determine whether the CDR circuitry was able to correctly recover the data despite the phase of the transmitter clock signal being modulated as at 320.

Possible modifications or extensions of the FIG. 9 methods may include changing the kind and/or amount of modulation at 320, and then again performing what is shown in FIG. 9 to identify the modulation level (if any) at which the CDR circuitry can no longer correctly recover data the transmitter is transmitting. For example, such a change of modulation may be a change in the frequency and/or the amplitude of the modulation.

Figure 10:
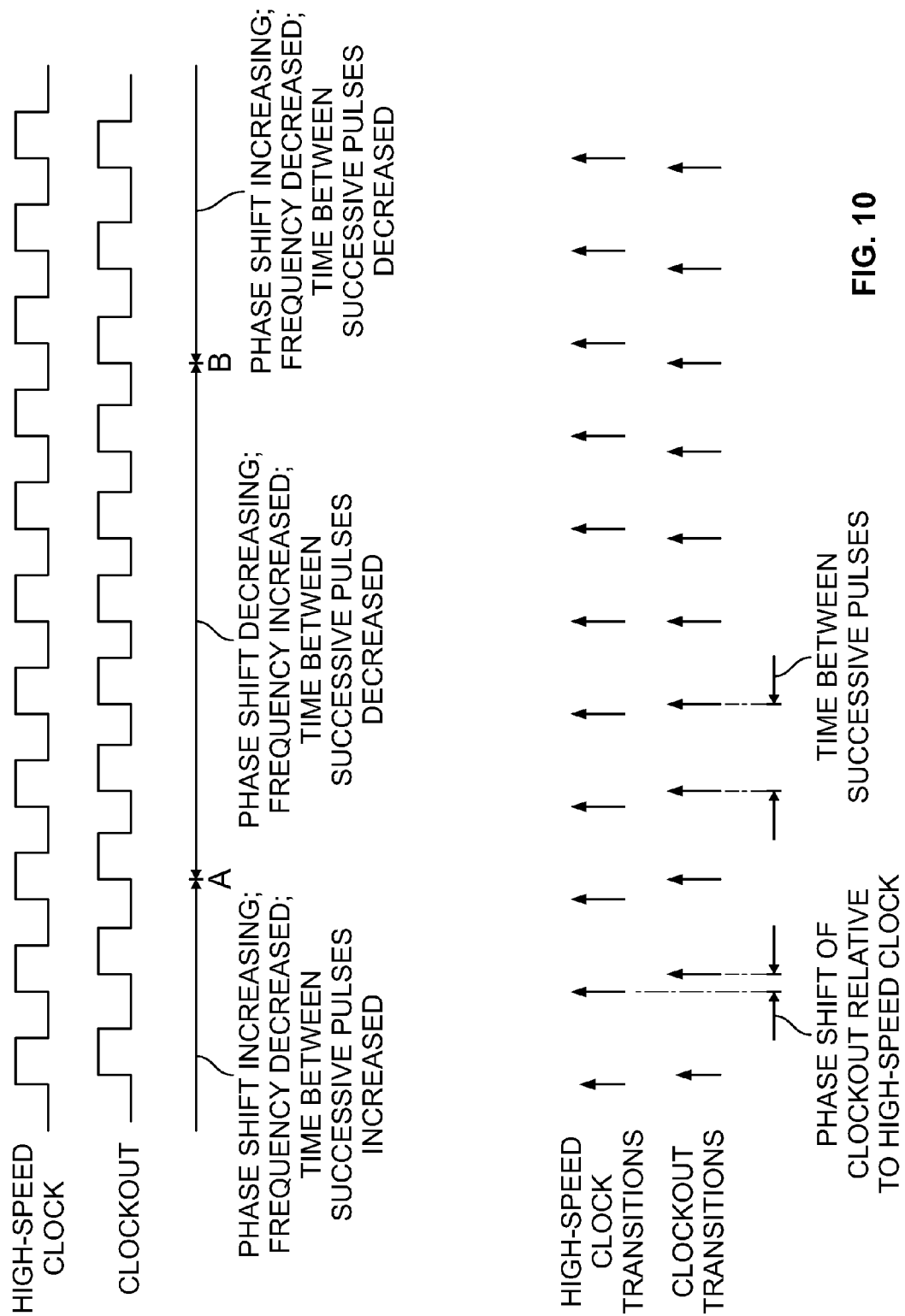
FIG. 10 includes simplified traces (waveforms) of illustrative signals (or signal characteristics) in accordance with certain possible aspects of the disclosure.

FIG. 10 provides graphical examples of some of the terms and concepts that are employed and referred to herein. Elapsed time increases to the right as shown in FIG. 10, and all portions of FIG. 10 are plotted against the same (common) horizontal time axis.

The top-most signal waveform in FIG. 10 is an illustrative high-speed clock signal waveform (e.g., as applied to clock modulator circuitry 130 in FIG. 5). This clock signal typically has a constant frequency (and phase), and it may sometimes be referred to herein as a reference clock signal.

The next signal waveform in FIG. 10 is an illustrative CLOCKOUT signal waveform (e.g., as output by clock modulation circuitry 130 in FIG. 5). The phase (or phase shift) of this CLOCKOUT signal is modulated relative to the (constant) phase of the above-mentioned high-speed clock signal. For example, up to point A in FIG. 10 the phase (or phase shift) of CLOCKOUT is increasing relative to the phase of the high-speed clock signal. (Note that phase shift (or relative phase) can be positive or negative. If it is negative, then it is "increased" by becoming less negative or by starting to become positive.) From point A to point B, the phase (or phase shift) of CLOCKOUT is decreasing relative to the phase of the high-speed clock signal. (In the particular example shown in FIG. 10 the phase or phase shift of CLOCKOUT relative to the high-speed clock signal gradually decreases from a positive value near point A to a negative value near point B.) To the right of point B, the phase (or phase shift) of CLOCKOUT is again increasing relative to the high-speed clock signal.

FIG. 10 also shows that the relevant feature of the high-speed clock signal and CLOCKOUT may alternatively be depicted in another way. Thus toward the bottom of FIG. 10 only the positive-going transitions in each of the high-speed clock signal and CLOCKOUT from above are depicted. These positive-going transitions may be the features of these signals that cause 1-bit synchronizer 150 in FIG. 5 to register and output each successive data bit output by serializer 110. In such a case, these positive-going transitions and their timing are the most relevant features of the high-speed clock signal and CLOCKOUT. (Such transitions may also be referred to as pulses, and they are shown like pulses toward the bottom of FIG. 10.)

FIG. 10 shows an example of what is meant by phase or phase shift. For example, the amount (time dimension) of one such phase shift between a pulse in the high-speed clock signal and a pulse in the CLOCKOUT signal is specifically labelled at the bottom of FIG. 10. This particular example of a phase shift is positive, but such phase shifts may also be negative as mentioned earlier. FIG. 10 also shows what is meant by terms like the time between successive pulses. One example of such a time between successive pulses in the CLOCKOUT signal is specifically labelled at the bottom of FIG. 10.

FIG. 10 also shows that terms or concepts like increasing (or decreasing) phase or phase shift may be characterized in other ways. For example, increasing phase shift of CLOCKOUT relative to the high-speed clock signal (e.g., to the left of point A or to the right of point B in FIG. 10) may be produced by decreasing the frequency of CLOCKOUT relative to the high-speed clock signal. Conversely, decreasing phase shift of CLOCKOUT relative to the high-speed clock signal (e.g., between points A and B in FIG. 10) may be produced by increasing the frequency of CLOCKOUT relative to the high-speed clock signal. Thus modulation of phase (or phase shift) and modulation of frequency may be alternative ways to describe and/or to implement the clock modulation performed by circuitry 130 in FIG. 5. Another alternative of this kind is increasing (or decreasing) time between successive pulses in the CLOCKOUT signal, which FIG. 10 also graphically depicts and describes, as has already been mentioned. For example, increasing the spacing between successive pulses in CLOCKOUT (e.g., to the left of point A or to the right of point B in FIG. 10) may be the same as or similar to increasing phase of CLOCKOUT. Conversely, decreasing the spacing between successive pulses in CLOCKOUT (e.g., between points A and B in FIG. 10) may be the same as or similar to decreasing phase of CLOCKOUT. Thus (again) modulation of time between successive clock pulses may be another way to describe and/or implement the clock modulation performed by circuitry 130 in FIG. 5.

FIG. 10 also illustrates the point that the term "successive" does not always necessarily mean "immediately next succeeding." Thus, for example, FIG. 10 calls out an example of "time between successive pulses," which omits the negative-going transition (or pulse) that is between those two positive-going transitions (or pulses).

This disclosure's ability to modulate the transmitted data allows transceivers in accordance with the disclosure to utilize a serial loop-back feature to test the performance margin of the CDR by phase shifting the incoming data until the points of failure have been captured. This is somewhat like performing an eye scan on the data.

An added benefit of this disclosure is that it offers a safeguard against any inaccuracies that can exist in various technology models. This can be important when working on new process nodes where the stability of the process technology has not been achieved. Pertaining to this disclosure, the addition of the controllable phase shifter or clock modulator 130 (which can be made programmable if desired) allows the ability to calibrate the critical timing phase relationship between the clock and data within the serializer. Instead of toggling (varying) the control bits of the phase shifter 130 as in margin-testing mode, a calibration circuit can be used to step through the phases and determine the optimal clock-to-data settings. These settings can then be either hard-coded or dynamically calculated if the data integrity of the link degrades. If the technology models are accurate, then the transmitter can be configured to bypass the phase shifter 130 within the serializer. However, if the models are inaccurate, then this disclosure enables the ability to calibrate the timing (e.g., using elements like 212). This can save the cost and time required for an IC fabrication mask change.

Among the possible benefits and advantages of this disclosure are that it enables on-chip, intrinsic evaluation of the performance margin of a CDR circuit without requiring external degradation of the transmitted signal. The disclosure can also allow CDR performance margins to be tested without the need to mount an IC (die) on a package or PCB. This can result in a test feature that is suitable for production testing. The disclosure can increase throughput of production performance testing since testing can be done within the chip and therefore with reduced setup complexity. This disclosure has little or no impact on the performance of existing circuitry since the disclosure uses a separate path (through element 130) within the serializer. This disclosure can have the added benefit of offering an additional path to calibrate the clock to fine-tune the clock-to-data relationship within the serializer to compensate for any technology model variances. This can save cost and time that might otherwise be required for a mask change.

Recapitulating and in some respects extending what has been said above, an integrated circuit (e.g., 100) in accordance with certain possible aspects of the disclosure may include transmitter circuitry (e.g., 110, 120, 130, 140, 150, 160) for producing a serial data output signal (e.g., OUT) in which successive data bits occur in synchronism with clock signal pulses. The integrated circuit may further include clock and data recovery ("CDR") circuitry (e.g., 200) for receiving a serial data input signal (e.g., output of 190) and recovering from the serial data input signal successive data bits based at least in part on clock information included in the serial data input signal as transitions between successive data bits in the serial data input signal (e.g., transitions in FIG. 3). The integrated circuit may still further include loop-back circuitry (e.g., 170, 180) for controllably applying the serial data output signal to the CDR circuitry as the serial data input signal. The integrated circuit may yet further include circuitry (e.g., 130) for modulating time between occurrence of successive ones of the clock signal pulses (e.g., as in the second signal trace in FIG. 10, or as in the pulse train at bottom of FIG. 10).

In an integrated circuit (e.g., 100) as recapitulated above, the circuitry for modulating (e.g., 130) may be controllably usable (e.g., by operation of 140) so that if the circuitry for modulating is not used, the time between occurrence of successive ones of the clock signal pulses is not modulated (e.g., as in the top signal trace in FIG. 10, or as in the next-to-bottom pulse train in FIG. 10).

In an integrated circuit (e.g., 100) as recapitulated above, the circuitry for modulating (e.g., 130) may be controllable with respect to frequency of the modulating (e.g., as shown in FIG. 10 by the second signal trace or the bottom pulse train).

In an integrated circuit (e.g., 100) as recapitulated above, the circuitry for modulating (e.g., 130) may be controllable with respect to amplitude of the modulating (e.g., maximum amount of "phase shift" like that illustrated toward the bottom of FIG. 10 (although that particular "phase shift" amount is not the maximum amount shown in FIG. 10)).

In an integrated circuit (e.g., 100) as recapitulated above, the circuitry for modulating (e.g., 130) may operate by shifting phase of successive ones of the clock signal pulses relative to phase of pulses in a reference clock signal (e.g., as shown in FIG. 1 by comparison of the top two signal traces or the bottom two pulse trains).

In an integrated circuit (e.g., 100) as recapitulated above, the CDR circuitry (e.g., 200) may be able to track modulation of the clock information in the serial data input signal (e.g., output of 190) up to a particular modulation frequency, and the circuitry for modulating (e.g., 130) may modulate the time between occurrence of successive ones of the clock signal pulses (e.g., as illustratively diagramed at the bottom of FIG. 10) at a frequency greater than the particular modulation frequency.

In an integrated circuit (e.g., 100) as recapitulated above, the circuitry for modulating (e.g., 130) may include a plurality of delay circuit elements (e.g., 132a-n) connected in series, the reference clock signal (e.g., top signal trace in FIG. 10) passing through the series of delay circuit elements to produce the clock signal pulses (e.g., next-to-top signal trace in FIG. 10 or bottom pulse train in FIG. 10); and control circuitry (e.g., 134) for controlling amounts of delay caused by the delay circuit elements.

In an integrated circuit (e.g., 100) as recapitulated above, the circuitry for modulating (e.g., 130) may include a plurality of delay circuit elements (e.g., 135a-n) connected in series, the reference clock signal (e.g., top signal trace in FIG. 10) passing in series through the delay circuit elements; and controllable selection circuitry (e.g., 137-139) for selecting an output signal of any one of at least some plural number of the delay circuit elements to produce the clock signal pulses (e.g., next-to-top signal trace in FIG. 10 or bottom pulse train in FIG. 10).

In accordance with certain other possible aspects of the disclosure, a method of testing clock and data recovery ("CDR") circuitry (e.g., 200) on an integrated circuit ("IC") (e.g., 100) may include using transmitter circuitry on the IC to produce a serial data output signal including successive data bits that are synchronized with successive pulses of a clock signal (e.g., as at 310); modulating time between the successive pulses (e.g., as at 320); applying the serial data output signal to the CDR circuitry as a serial data input signal (e.g., as at 330); using the CDR circuitry to recover successive data bits from the serial data input signal based at least in part on clock information included in the serial data input signal as transitions between successive data bits in the serial data input signal (e.g., as at 340); and comparing the successive data bits recovered by the CDR circuitry to the successive data bits included by the transmitter circuitry in the serial data output signal to determine whether the CDR circuitry was able to correctly recover the data with the time between the successive pulses being modulated (e.g., as at 350).

In a method as recapitulated above, the modulating (e.g., as at 320) may be controllable with respect to frequency of the modulating (e.g., rate of change of "phase shift" as shown in FIG. 10).

In a method as recapitulated above, the modulating (e.g., as at 320) may be controllable with respect to amplitude of the modulating (e.g., maximum amount of change of "phase shift" as shown in FIG. 10).

In a method as recapitulated above, the modulating (e.g., as at 320) may include shifting phase of successive ones of the clock signal pulses relative to phase of pulses in a reference clock signal.

In a method as recapitulated above, the CDR circuitry (e.g., 200) may be able to track modulation of the clock information in the serial data input signal up to a particular modulation frequency, and wherein the modulating (e.g., as at 320) may include modulating the time between occurrence of successive ones of the clock signal pulses (e.g., as diagramed at the bottom of FIG. 10) at a frequency greater than the particular modulation frequency.

In accordance with certain other possible aspects of the disclosure, an integrated circuit (e.g., 100) may include transmitter circuitry (e.g., 110, 120, 130, 140, 150, 160) for producing a serial data output signal (e.g., OUT) in which successive data bits occur in synchronism with clock signal pulses; clock signal circuitry (e.g., 120) for making available a first clock signal; phase shift circuitry (e.g., 130) for shifting phase of the first clock signal by a controllably selectable amount to produce a second clock signal; and selection circuitry (e.g., 140) for controllably selecting one of the first and second clock signals as a source of the clock signal pulses.

An integrated circuit (e.g., 100) as recapitulated above may further include programmable circuitry (e.g., 212) for controlling the amount of phase shifting performed by the phase shift circuitry (e.g., 130).

An integrated circuit (e.g., 100) as recapitulated above may still further include programmable circuitry (e.g., MODULATION SELECTOR) for controlling the selecting performed by the selection circuitry (e.g., 140).

An integrated circuit (e.g., 100) as recapitulated above may still further include modulation control circuitry (e.g., 134 or 137) for controlling the phase shift circuitry to modulate the shifting performed by the phase shift circuitry (e.g., 130).

In an integrated circuit (e.g., 100) as recapitulated above, the modulation control circuitry (e.g., 134 or 137) may control frequency of modulation of the shifting performed by the phase shift circuitry (e.g., 130)

In an integrated circuit (e.g., 100) as recapitulated above, the modulation control circuitry (e.g., 134 or 137) may control amplitude of modulation of the shifting performed by the phase shift circuitry.

An integrated circuit (e.g., 100) as recapitulated above may further include clock and data recovery ("CDR") circuitry (e.g., 200) for recovering successive data bits from a serial data input signal (e.g., output of 190) based at least in part on clock information embodied as transitions between successive bits in the serial data input signal; and loop-back circuitry (e.g., 170, 180) for controllably routing the serial data output signal to the CDR circuitry for use as the serial data input signal.

It will be understood that the foregoing is only illustrative of the principles of the invention, and that various modifications can be made by those skilled in the art without departing from the scope and spirit of the invention. For example, the width of the parallel data input bus can be more or less than the 20-bit width shown in FIG. 5. Examples of the kinds of ICs that may include, employ, and/or be tested using subject matter of this disclosure are programmable logic devices ("PLDs"), field-programmable gate arrays ("FPGAs"), programmable microcontrollers, and other ICs that include high-speed serial data transceiver circuitry with CDR capability.

What is claimed is:
1. An integrated circuit comprising:
transmitter circuitry for producing a serial data output signal in which successive output data bits occur in synchronism with output clock signal pulses;
clock and data recovery ("CDR") circuitry for receiving a serial data input signal and recovering from the serial data input signal successive data bits based at least in part on clock information included in the serial data input signal as transitions between successive data bits in the serial data input signal;

loop-back circuitry for controllably applying the serial data output signal to the CDR circuitry as the serial data input signal; and
circuitry for controllably modulating time, based on an externally-supplied control signal, between occurrence of successive ones of the output clock signal pulses wherein:
the CDR circuitry tracks modulation of the clock information in the serial data input signal up to a maximum trackable modulation frequency, and wherein the circuitry for controllably modulating time modulates the time between occurrence of successive ones of the output clock signal pulses at a frequency greater than the maximum trackable modulation frequency.

2. The integrated circuit defined in claim 1 wherein the circuitry for controllably modulating time is controllably usable so that if the circuitry for controllably modulating time is not used, the time between occurrence of successive ones of the output clock signal pulses does not change.

3. The integrated circuit defined in claim 1 wherein the circuitry for controllably modulating time operates by shifting phase of successive ones of the output clock signal pulses relative to phase of pulses in a reference clock signal.

4. The integrated circuit defined in claim 3 wherein the circuitry for controllably modulating time comprises:
a plurality of delay circuit elements connected in series, the reference clock signal passing through the series of delay circuit elements to produce the output clock signal pulses; and
control circuitry for controlling amounts of delay caused by the delay circuit elements.

5. The integrated circuit defined in claim 3 wherein the circuitry for controllably modulating time comprises:
a plurality of delay circuit elements connected in series, the reference clock signal passing in series through the plurality of delay circuit elements; and
controllable selection circuitry for selecting an output signal of any one of at least some plural number of the delay circuit elements to produce the output clock signal pulses.

6. A method of testing clock and data recovery ("CDR") circuitry on an integrated circuit ("IC") comprising:
using transmitter circuitry on the IC to produce a serial data output signal including successive data bits that are synchronized with successive pulses of a clock signal;
controllably modulating, based on an externally-supplied control signal, time between the successive pulses;
applying the serial data output signal to the CDR circuitry as a serial data input signal;
using the CDR circuitry to recover successive data bits from the serial data input signal based at least in part on clock information included in the serial data input signal as transitions between successive data bits in the serial data input signal; and
comparing the successive data bits recovered by the CDR circuitry to the successive data bits included by the transmitter circuitry in the serial data output signal to determine whether the CDR circuitry was able to correctly recover the data with the time between the successive pulses being modulated; wherein:
the CDR circuitry tracks modulation of the clock information in the serial data input signal up to a maximum trackable modulation frequency; and
the controllable modulating comprises modulating the time between occurrence of successive ones of the clock signal pulses at a frequency greater than the maximum trackable modulation frequency.

7. The method defined in claim 6 wherein the controllable modulating comprises:
shifting phase of successive ones of the clock signal pulses relative to phase of pulses in a reference clock signal.

8. An integrated circuit comprising:
transmitter circuitry for producing a serial data output signal in which successive output data bits occur in synchronism with output clock signal pulses;
clock signal circuitry for making available a first clock signal;
phase shift circuitry for shifting phase of the first clock signal by a controllably selectable amount to produce a second clock signal;
programmable circuitry for controlling the phase shift circuitry to control, based on an externally-supplied control signal, the amount of phase shifting performed by the phase shift circuitry; and
selection circuitry for controllably selecting one of the first and second clock signals as a source of the output clock signal pulses; wherein:
the programmable circuitry comprises modulation control circuitry that tracks modulation of clock information in a serial data input signal up to a maximum trackable modulation frequency; and
the modulation control circuitry modulates the time between occurrence of successive ones of the output clock signal pulses at a frequency greater than the maximum trackable modulation frequency.

9. The integrated circuit defined in claim 8 further comprising:
programmable circuitry for controlling the selecting performed by the selection circuitry.

10. The integrated circuit defined in claim 8 further comprising:
clock and data recovery ("CDR") circuitry for recovering successive data bits from the serial data input signal based at least in part on clock information embodied as transitions between successive bits in the serial data input signal; and
loop-back circuitry for controllably routing the serial data output signal to the CDR circuitry for use as the serial data input signal.

* * * * *